United States Patent [19]
Norton et al.

[11] Patent Number: 4,914,495
[45] Date of Patent: Apr. 3, 1990

[54] PHOTODETECTOR WITH P LAYER COVERED BY N LAYER

[75] Inventors: Paul R. Norton, Santa Barbara; Michael Moroz; Carol S. Talley, both of Goleta, all of Calif.

[73] Assignee: Santa Barbara Research Center, Goleta, Calif.

[21] Appl. No.: 804,711

[22] Filed: Dec. 5, 1985

[51] Int. Cl.$^4$ ............................................. H01L 27/14
[52] U.S. Cl. ........................................ 357/30; 357/16; 357/20; 357/32; 357/90
[58] Field of Search .................. 357/30, 30 B, 31, 32, 357/61, 90, 20, 16

[56] References Cited

U.S. PATENT DOCUMENTS

| | | | |
|---|---|---|---|
| 3,799,803 | 3/1974 | Kraus et al. | 357/30 |
| 4,132,999 | 1/1979 | Maillé et al. | 357/30 |
| 4,206,003 | 6/1980 | Koehler | 357/30 X |
| 4,435,224 | 3/1984 | Durand | 357/61 X |

FOREIGN PATENT DOCUMENTS 2471053  6/1981  France ........................ 357/30 B

OTHER PUBLICATIONS

Kohn, "1-2 Micron (HgCd)Te Photodetectors", IEEE Transactions on Electron Devices, vol. ED-16, No. 10, Oct., 1969, p. 885.

*Primary Examiner*—William Mintel
*Attorney, Agent, or Firm*—W. C. Schubert; W. K. Denson-Low

[57] ABSTRACT

Photodetectors that produce detectivities close to the theoretical maximum detectivity include an electrically insulating substrate carrying a body of semiconductive material that includes a region of first conductivity type and a region of second conductivity type where the first region overlies and substantially covers the top and sides of the region of second conductivity type and where the junction between the first and second regions creates a depletion layer that separates minority carriers in the region of second conductivity type from majority carriers in the region of first conductivity type. These photodetectors produce high detectivities where radiation incident on the detectors has wavelengths in the range of about 1 to about 25 microns or more, particularly under low background conditions.

15 Claims, 1 Drawing Sheet

PHOTODETECTOR WITH P LAYER COVERED BY N LAYER

FIELD OF THE INVENTION

This invention relates to methods for making trapping-mode photodetectors that produce detectable signals from incident radiation such as infrared radiation having wavelengths in the range of about 1 to about 25 microns or more, particularly where the radiation appears in low background level energy fields, such as, for example, fields with background flux levels less than about $10^{17}$ photons/$cm^2$-sec. The invention also relates to the photodetectors so made.

BACKGROUND OF THE INVENTION

Photoconductive detectors made of mercury cadmium telluride semiconductor material are disclosed in U.S. Pat. No. 3,949,223, issued Apr. 6, 1976, and entitled, "Monolithic Photoconductive Detector Array." The '223 patent also discloses several methods for making such detectors, but none of these methods produces a detector that operates close to the theoretical maximum detectivity for wavelengths in the range of about 1 to about 25 microns, particularly for wavelengths in the range of about 10 to about 25 microns, and more particularly where such radiation appears in low background levels such as those having less than about $10^{17}$ photons/$cm^2$-sec.

A concurrently-filed, commonly assigned U.S. application entitled, "Photoconductive Detectors and Methods of Making Such Detectors," describes other processes for making photodetectors of the kinds disclosed hereinbelow.

SUMMARY OF THE INVENTION

The photodetectors of this invention produce detectivities close to the theoretical maximum detectivity of $2.52 \times 10^{18} \lambda (\eta/Q_B)^{\frac{1}{2}} cmHz^{\frac{1}{2}}$/Watt, where $\eta$ is the quantum efficiency, and $Q_B$ is the background photon flux, and $\lambda$ is the wavelength of the radiation incident on the detector, and at least about $2 \times 10^{17} \lambda (\eta/Q_B)^{\frac{1}{2}} cmHz^{\frac{1}{2}}$/Watt, where the radiation incident on the detectors is in the range of about 1 microns to about 25 microns or more, more particularly in the range of about 10 microns to about 25 microns or more. These detectors are particularly effective in producing signals from such incident radiation under low background radiation conditions, meaning radiation levels of less than about $10^{17}$ photons/$cm^2$-sec, and where the temperature under which the detector operates is sufficiently low to minimize thermal generation and recombination of excess carriers. In preferred embodiments, the duration of the signals produced by the new photodetectors at background levels in the range of about $10^{10}$ to about $10^{13}$ photons/$cm^2$-sec is at least about 50 microseconds and ranges as high as 100 microseconds or higher.

The new photodetectors comprise a substrate that is electrically insulating, such as a dielectric or wide bandgap semiconductor, attached to a body of semiconductor material comprising a region of first conductivity type and a region of a second, opposite conductivity type, said first region substantially completely overlying the top and sides of the active area of said second region, said first and second regions having a junction extending along substantially the entire length of the active area of the second region, said second region tending to trap minority carriers and to separate minority carriers from majority carriers in said first region for a time sufficient to produce a detectable signal from radiation incident on said photodetector where said radiation has wavelengths in the range of about b 1 to about 25 microns.

These photodetectors may alternatively be defined as comprising a body of semiconductor material comprising a region of first conductivity type substantially completely overlying the top and sides of the active area of a region of second conductivity type, with the region of second conductivity type overlying an electrically insulating substrate, and with the body being epitaxially grown on one substrate. The first region and second region have a junction extending along substantially the entire length of the region of second conductivity type or along the active area of the region of the second conductivity type. The region of second conductivity type tends to trap minority carriers, and to separate them from majority carriers remaining in the first region when radiation impinges on the photodetector.

The region of first conductivity type has a narrow energy band-gap. The region of second, opposite conductivity type may have an energy band-gap substantially the same as, or different from the region of first conductivity type. This region of second type may have an energy band-gap that is substantially uniform and either the same as or larger than the energy band-gap in the first region, or may vary, linearly or non-linearly, across the second region.

The new methods comprise growing or depositing a body of semiconductive material, epitaxially, on a substrate, with the body lying entirely on the surface of the substrate. Thereafter, the new methods call for subdividing the body of photoconductive material, by ion etching or otherwise, into a plurality of detectors on a common substrate. Then, the subdivided body of photoconductive material, carried on the substrate, is annealed to form regions of first and second conductivity types atop the substrate. The annealing takes place for a time, and at a temperature sufficient to insure that the region of first conductivity type overlies the region of second conductivity type at both the top and the sides of the region of second conductivity type, thereby minimizing or avoiding altogether surface current leakage between the two regions.

After epitaxially growing the body of semiconductor material, and either before or after etching or otherwise subdividing this body, and either before or after annealing to form regions of the first and second conductivity types, an additional layer can be grown, epitaxially, atop the body of semiconductor material and substrate, to function as a means for minimizing diffusion of minority carriers to electrical contacts affixed to the top of the detectors.

BRIEF DESCRIPTION OF THE DRAWING

The drawing shows, in cross-section, a photodetector made in accordance with a preferred embodiment by the process of this invention.

DETAILED DESCRIPTION OF THE INVENTION

Figure 1:
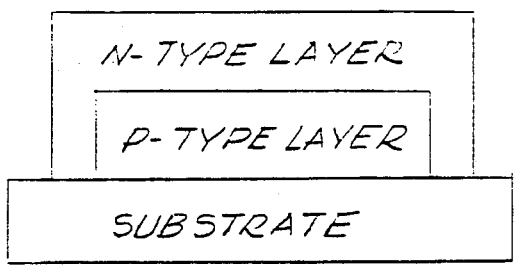

The methods for making photodetectors of the kind shown in the drawing preferably utilize a tellurium-rich or mercury-rich melt comprising mercury telluride and cadmium telluride in molten form. Photodetectors made from such melts comprise mercury cadmium telluride having the general formula $Hg_{1-x}Cd_xTe$, where x is in the range of about 0.95 to about 0.13. While this detailed description speaks in terms of mercury cadmium telluride semiconductor material, the methods of the invention and/or the structures produced are applicable to the manufacture of photodetectors from other substances, such as III–V, II–VI and IV–VI semiconductor alloys, particularly those having narrow bandgap detecting layers.

To make a photodetector of the kind shown in the drawing from mercury cadmium telluride, a dielectric or wide band-gap semiconductor substrate (such as a cadmium telluride substrate) of relatively high resistivity, meaning a resistivity in the range of about $10^3$ to about $10^8$ ohm-cm, is covered with a tellurium melt solution including a predetermined amount of mercury and cadmium. This tellurium melt solution is permitted to cool on the substrate to a temperature where the melt is super-saturated, thereby forming an epitaxial layer of mercury cadmium telluride thereon. Preferably, the epitaxially-deposited layer of mercury cadmium telluride has an excess of tellurium atoms, or a deficiency of mercury atoms (mercury vacancies), in the crystal layer, such that its electrical type is dominated by hole carriers (p-type). The p-type concentration, as grown, is typically in the $10^{15}$–$10^{18}/cm^3$ range. Alternately, a mercury melt solution may be used to grow the layer having the same properties.

After formation of the epitaxial layer, the body of semiconductor material is subdivided into a plurality of detectors by a suitable method such as chemical etching, plasma etching, or ion beam etching. To ion etch, plasma etch or to chemical etch, a photoresist pattern is applied to the surface of the body of semiconductor material, and the exposed material is etched through the epitaxial layer to the substrate. In one embodiment, following ion beam etching, the photoresist pattern is left in place on the epitaxial layer. The body is then subjected to light chemical etching, as by spraying the body with a dilute solution of bromine in ethylene glycol, to remove mechanical damage on the side walls of each detector in the array. Thereafter, etching is completed by dipping the array in a very dilute solution of bromine in methanol. When etching is complete, the etched surface can be rinsed in solvents such as methanol, acetone and isopropanol.

After formation and subdivision of the epitaxial layer, the substrate carrying the semiconductive, epitaxially grown layer is annealed, preferably in a vapor comprising mercury, at a temperature in the range of about 200° C. to about 300° C., for a time in the range of about 0.1 to about 100 hours, or at least for a time sufficient to form an n-type detector layer at the surface of the epitaxial semiconductor body, with a p-type layer beneath the n-type detector layer, and with the PN junction of the two layers extending substantially along the length of the p-type layer and along its side walls as well, to the substrate of the photodetector.

Before or after the annealing step, an additional layer may be deposited, epitaxially, on the surface of the n-type detector layer. This additional surface layer has a wider band-gap than the first epitaxial layer and can also be made of mercury cadmium telluride, preferably from a mercury melt solution including cadmium and tellurium, or may be made of cadmium telluride or other materials so that the layer prevents or minimizes diffusion of minority carriers to electrodes attached to the top of the detectors of this invention.

After formation of the semiconductor array by the methods of this invention, electrodes can be attached to each of the discrete detectors, or to as many as desired, to form a system including a plurality of detectors. An electrical bias may be applied to any or all of the detectors by connecting the electrodes on the detectors in series with a battery and load resistor. The electrical bias may be applied by other means, a few examples of which are a pulsing direct current source, an alternating current source, direct connection to a transistor, a microwave generator, or from an integrated circuit multiplexer readout circuit.

The n-type detector region atop the detectors of this invention has a small, relatively uniform energy bandgap which can be on the order of about 0.1 electron volt or less. A substantial advantage of the structure and method used to make these detectors results from the low carrier concentration (less than $10^{15}/cm^3$) which is achieved in the n-type region. This low concentration products a wide depletion layer at the PN junction which minimizes parasitic tunneling leakage currents between the p-type and n-type regions. For trapping minority carrier holes, the energy gap of the p-type region is substantially equal to the full energy band-gap of the detector layer, and may effectively be higher by virtue of being located within the compositionally graded interface between the surface of the epitaxial layer and the substrate. Accordingly, detectors made with this structure and by this method are less susceptible to performance degradation caused by tunneling leakage across the PN junction because of their wider depletion layers; less susceptible to surface leakage since the p-n junction may intersect the surface within a wider band-gap portion of the epitaxial layer, or may only intersect against the substrate of the detector; and more temperature stable because there may be a wider band-gap in the trapping p-type layer. One or more of these features, embodied in the new detectors, makes them superior to known detectors such as those disclosed in the '223 patent.

What is claimed is:

1. A photodetector having a detectivity of at least about $2 \times 10^{17} \lambda (\eta/Q_B)^{\frac{1}{2}} cmHz^{\frac{1}{2}}/Watt$, where $\lambda$ is the wavelength of radiation incident on said photodetector, $Q_B$ is the background photon flux, and $\eta$ is the quantum efficiency, and where the radiation incident on said photodetector is in the range of about 1 to about 25 microns, and comprising an electrically insulating substrate attached to a body of semiconductor material comprising a region of first conductivity type and a region of second, opposite conductivity type, said region of first conductivity type substantially completely overlying the top and sides of said region of second conductivity type, said region of second conductivity type tending to trap, and to separate minority carriers from majority carriers in said region of first conductivity type.

2. The photodetector of claim 1 wherein said incident radiation appears under low background radiation conditions in the range of about $10^{17}$ to about $10^6$ photons/$cm^2$-sec.

3. The photodetector of claim 2 wherein said region of first conductivity type is an n-type region, and said region of second conductivity type is a p-type region.

4. The photodetector of claim 3 wherein said electrically insulating substrate is a dielectric substrate.

5. The photodetector of claim 4 wherein the n-type region has a small, relatively uniform energy band-gap and is lightly doped, a depletion layer lies in a lightly-doped region between the n-type and p-type regions, and the energy of the p-type region is at least about the same as, or greater than the full energy band-gap of the n-type region.

6. The photodetector of claim 5 further comprising an epitaxial layer overlying said region of first conductivity type, said overlying layer minimizing diffusion and drifting of minority carriers to electrode means linked to said layer.

7. The photodetector of claim 6 wherein said regions of first and second conductivity types are each comprised of mercury cadmium telluride, and are made from alloys comprising tellurium or mercury.

8. A photodetector array comprising a subdivided body of semiconductor material, each of said photodetectors in said array comprising a region of first conductivity type substantially completely overlying the top and sides of a region of second conductivity type, said region of said second conductivity type overlying an electrically insulating substrate, said body being epitaxially grown on said substrate, said region of second conductivity type tending to trap, and to separate minority carriers from majority carriers in said radiation of first conductivity type when radiation impinges on said photodetector.

9. The photodetector array of claim 8 wherein each of said photodetectors has a detectivity of at least about $2 \times 10^{17} \lambda (\eta/Q_B)^{\frac{1}{2}} cmHz^{\frac{1}{2}}/Watt$, where $\lambda$ is the wavelength of radiation incident on said photodetectors, $Q_B$ is the background photons flux, and $\eta$ is the quantum efficiency, and where the radiation incident on said photodetectors is in the range of about 1 to about 25 microns.

10. The photodetector array of claim 9 wherein said incident radiation appears under low background radiation conditions in the range of about $10^{17}$ to about $10^6$ photons/cm$^2$-sec.

11. The photodetector array of claim 10 wherein said region of first conductivity type is an n-type region, and said region of second conductivity type is a p-type region.

12. The photodetector array of claim 11 wherein said electrically insulating substrate is a dielectric substrate.

13. The photodetector array of claim 12 wherein the n-type region has a small, relatively uniform energy band-gap, a depletion layer lies in a lightly-doped region between the n-type and p-type regions, and the energy gap of the p-type region is about the same as, or larger than the full energy band-gap of the n-type region.

14. The photodetector array of claim 13 further comprising a layer overlying said region of first conductivity type, said overlying layer minimizing diffusion and drifting of minority carriers to electrode means linked to said layer.

15. The photodetector array of claim 14 wherein said regions of first and second conductivity types are each comprised of mercury cadmium telluride, and are made from alloys comprising tellurium or mercury.

* * * * *

UNITED STATES PATENT AND TRADEMARK OFFICE
CERTIFICATE OF CORRECTION

PATENT NO. : 4,914,495

DATED : April 3, 1990

INVENTOR(S) : Paul R. Norton, Michael Moroz

It is certified that error appears in the above-identified patent and that said Letters Patent is hereby corrected as shown below:

Title should read:

PHOTODETECTOR WITH P LAYER COVERED BY N LAYER

Signed and Sealed this

Ninth Day of July, 1991

Attest:

HARRY F. MANBECK, JR.

*Attesting Officer*     *Commissioner of Patents and Trademarks*